United States Patent
Kim et al.

(10) Patent No.: US 7,539,041 B2
(45) Date of Patent: May 26, 2009

(54) FLOATING BODY SEMICONDUCTOR MEMORY DEVICE AND METHOD OF OPERATING THE SAME

(75) Inventors: Doo-Gon Kim, Suwon-si (KR); Duk-Ha Park, Suwon-si (KR); Myoung-Gon Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 126 days.

(21) Appl. No.: 11/781,331

(22) Filed: Jul. 23, 2007

(65) Prior Publication Data

US 2008/0101114 A1 May 1, 2008

(30) Foreign Application Priority Data

Oct. 30, 2006 (KR) .................... 10-2006-0105838

(51) Int. Cl.
G11C 11/24 (2006.01)

(52) U.S. Cl. ............................ 365/149; 365/207
(58) Field of Classification Search ................ 365/149, 365/207, 203
See application file for complete search history.

(56) References Cited

U.S. PATENT DOCUMENTS 5,877,978 A * 3/1999 Morishita et al. ............ 365/149
6,567,330 B2 5/2003 Fujita et al.
6,882,008 B1 4/2005 Ohsawa
7,123,509 B2 * 10/2006 Ohsawa ..................... 365/184
7,433,223 B2 * 10/2008 Kim et al. .................. 365/149
7,440,329 B2 * 10/2008 Ohsawa .................. 365/185.2
2003/0231524 A1 12/2003 Ohsawa
2005/0068807 A1 3/2005 Ohsawa

FOREIGN PATENT DOCUMENTS

| JP | 2005-302077 | 10/2005 |
|----|-------------|---------|
| JP | 2005-332495 | 12/2005 |
| JP | 2006-073061 | 3/2006 |

* cited by examiner

*Primary Examiner*—Anh Phung
(74) *Attorney, Agent, or Firm*—Volentine & Whitt, PLLC (57) ABSTRACT

A semiconductor memory device includes a memory cell array having first and second blocks, respectively including first and second memory cells with floating bodies. The first memory cell is connected between a first bit line and a source line, and the second memory cell is connected between a second bit line and the source line. A sense amplifier equalizes the sense bit line and the inverted sense bit line to be an equalization voltage during an equalization operation, pre-charges the sense bit line and the inverted sense bit line to first and second pre-charge voltages during a pre-charge operation, and amplifies a voltage difference between the sense bit line and the inverted sense bit line during read and write operations. The first pre-charge voltage is higher than the equalization voltage and the second pre-charge voltage is higher than the equalization voltage and lower than the first pre-charge voltage.

28 Claims, 6 Drawing Sheets

FLOATING BODY SEMICONDUCTOR MEMORY DEVICE AND METHOD OF OPERATING THE SAME

CROSS-REFERENCE TO RELATED APPLICATION

A claim of priority is made to Korean Patent Application No. 10-2006-0105838, filed Oct. 30, 2006, the subject matter of which is hereby incorporated herein by reference.

BACKGROUND OF THE INVENTION

1. Field of the Invention

The present invention relates to a semiconductor memory device. More particularly, the present invention relates to a semiconductor memory device having a memory cell, including a floating body transistor, and a method of operating the same.

2. Description of the Related Art

A typical dynamic memory cell in a semiconductor memory device includes an access transistor and a corresponding data storage capacitor. Data "1" is stored when there is a charge in the capacitor, and data "0" is stored when there is no charge in the capacitor. However, the capacitor charge dissipates after a predetermined time lapses, and thus the capacitor needs to be periodically refreshed (re-stored). A semiconductor memory device, which has a memory cell array including dynamic memory cells having such capacitors, is limited with respect to reducing the semiconductor memory device layout size.

Therefore, transistors having floating bodies were developed. A floating body transistor stores a majority carrier, and needs to be refreshed since the stored majority carrier dissipates after a predetermined time lapses. A memory cell including a floating body transistor does not have a capacitor, but it is used as a dynamic memory cell because it operates similarly to the capacitor with respect to being refreshed. Since one transistor having a floating body constitutes one memory cell, the layout size of the semiconductor memory device fabricated with floating body transistors may be significantly smaller than a semiconductor memory device fabricated with the typical capacitor memory cells, assuming the two types of semiconductor memory devices have the same capacity.

Figure 1:
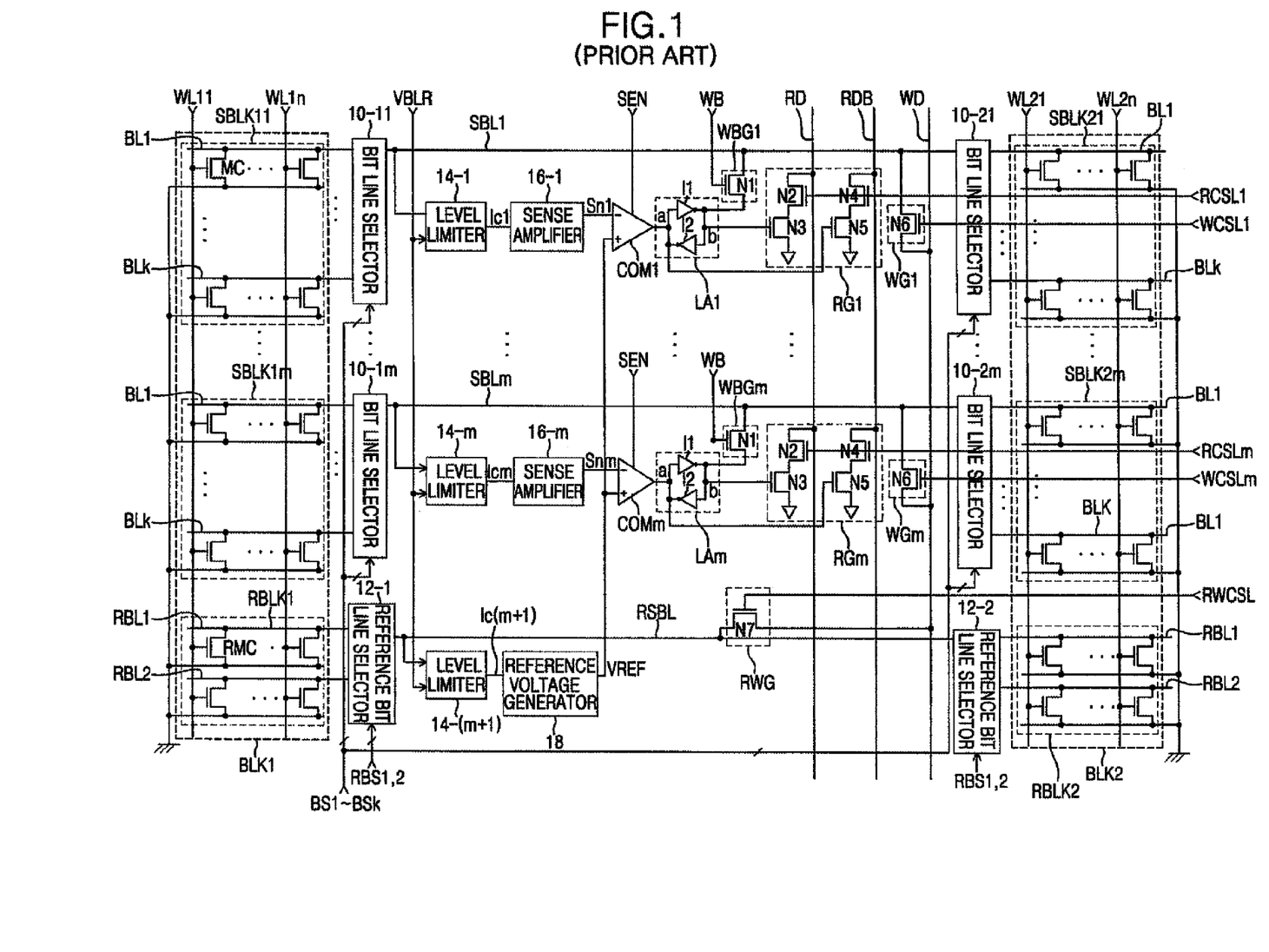
FIG. 1 is a circuit diagram illustrating a conventional semiconductor memory device, which includes a memory cell with a floating body.

FIG. 1 is a circuit diagram illustrating a conventional semiconductor memory device having a memory cell with a floating body transistor. The semiconductor memory device of FIG. 1 includes memory cell array blocks BLK1 and BLK2, bit line selectors 10-11 to 10-1m and 10-21 to 10-2m, a reference bit line selector 12-1, level limiters 14-1 to 14-m and 14-(m+1), sense amplifiers 16-1 to 16-m, a reference voltage generator 18, comparators COM1 to COMm, latches LA1 to LAm, write back gates WBG1 to WBGm, read column selecting gates RG1 to RGm, write column selecting gates WG1 to WGm, and a reference write column selecting gate RWG.

The functions of the components of FIG. 1 are described below. During a write operation, in the memory cells MC and the reference memory cells RMC of each of the memory cell array blocks BLK1 and BLK2, when a voltage of a predetermined level (e.g., 1.5V) is applied to a corresponding word line and a voltage having a level higher than a predetermined level (e.g., 1.5V) is applied to a corresponding bit line, electron-hole pairs are produced around a drain of the NMOS transistors, which form the memory cells due to impact ionization. The electrons among the electron-hole pairs are absorbed into the drain of the NMOS transistor and holes among the electron-hole pairs are stored in the floating body, thereby writing data "1". That is, when data "1" is written, the NMOS transistor operates in a floating region. In contrast, when a voltage of a predetermined level (e.g., 1.5V) is applied to a corresponding word line and a voltage having a level lower than a predetermined level (e.g., −1.5V) is applied to a corresponding bit line, the floating body and the drain of the NMOS transistor are biased in a forward direction, so that most of the holes stored in the floating body are discharged to the drain, thereby writing data "0". When data "1" is stored, a threshold voltage of the NMOS transistor is reduced, and when data "0", is stored, a threshold voltage of the NMOS transistor is increased.

During a read operation, when a voltage of a predetermined level (e.g., 1.5V) is applied to a corresponding word line and a voltage (e.g., 0.2V) for making the transistor operate in a linear region is applied to a corresponding bit line, a current difference occurs in the corresponding bit line, and data "0" and data "1" are read by sensing the current difference. When the memory cell stores data "1", since the threshold voltage is low, the bit line current of when data "1" is read becomes greater.

When the memory cell stores data "0", since the threshold voltage is high, the bit line current of when data "0" is read becomes smaller. The bit line selectors 10-11 to 10-1m and 10-21 to 10-2m respectively select one of k bit lines BL1 to BLk of each of sub memory cell array blocks SBLK11 to SBLK1m and SBLK21 to SBLK2m to be connected to corresponding sense bit lines SBL1 to SBLm in response to bit line selecting signals BS1 to BSk. Each of the reference bit line selectors 12-1 and 12-2 connects reference bit lines RBL1 and RBL2 of each of the reference memory cell array blocks RBLK1 and RBLK2 to a reference bit line RSBL in response to corresponding reference bit line selecting signals RBS1, 2. The level limiters 14-1 to 14-m and 14-(m+1) respectively block corresponding current Ic1 to Ic(m+1) from being supplied to the corresponding sense bit lines SBL1 to SBLm and the reference sense bit line RSBL when the sense bit lines SBL1 to SBLm and the reference sense bit line RSBL are higher in voltage level than a restriction voltage level VBLR. That is, when the restriction voltage level is set to about 0.2V, a voltage for a read operation is applied to the bit lines BL1 to BLk and the reference bit lines RBL1 and RBL2 by the level limiters 14-1 to 14-(m+1), so that the corresponding currents Ic to Ic(m+1) flow.

The restriction voltage is set to 0.2V, which is relatively low, because when the restriction voltage is set to a voltage greater than 0.2V, the NMOS transistor having a floating body is biased in a saturation state, so that data "0" may be read as "1" due to the impact ionization. The reference voltage generator 18 generates a reference voltage VREF depending on the current Ic(m+1). The sense amplifiers 16-1 to 16-m detect the corresponding current Ic1 to Icm to generate voltages depending on the corresponding current Ic1 to Icm, respectively. The reference voltage VREF output from the reference voltage generator 18 has a voltage value between a voltage corresponding to data "0" and a voltage corresponding to data "1," which are respectively output from the sense amplifiers 16-1 to 16-m.

A conventional semiconductor memory device like that of FIG. 1 is disclosed, for example, in U.S. Patent Application Publication No. 2003-231524, and semiconductor memory devices which include floating body memory cells and reference memory cells are disclosed, for example, in U.S. Patent Application Publication No. 2005-68807, and U.S. Pat. Nos. 6,567,330 and 6,882,008.

However, conventional semiconductor memory devices having floating body memory cells have complicated circuit configurations, which include, for example, reference memory cells, level limiters, sense amplifiers (current sense amplifiers), comparators, latches, and write back gates, in order to perform a read operation, as shown in FIG. 1. Also, the operation and control of such semiconductor memory devices are complicated. In addition, the conventional semiconductor memory devices having floating body memory cells should perform a refresh operation (re-storing operation) after the read operation.

SUMMARY OF THE INVENTION

An aspect of the present invention provides a semiconductor memory device, having a memory cell array including a first block and a second block. The first block includes a first memory cell having a first floating body and the second block includes a second memory cell having a second floating body. The first memory cell is connected between a first bit line and a source line to which a source voltage is applied, and has a first gate connected to a first word line, and the second memory cell is connected between a second bit line and the source line, and has a second gate connected to a second word line. The semiconductor memory device further includes a bit line isolation portion for transmitting data between the first bit line and a sense bit line, and for transmitting data between the second bit line and an inverted sense bit line. It also includes a sense amplifier for equalizing the sense bit line and the inverted sense bit line to be an equalization voltage during an equalization operation, for pre-charging one of the sense bit line or the inverted sense bit line to a first pre-charge voltage and the other of the sense bit line or the inverted sense bit line to a second pre-charge voltage during a pre-charge operation, and for sensing and amplifying a voltage difference between the sense bit line and the inverted sense bit line during read and write operations. The first pre-charge voltage is higher than the equalization voltage, and the second pre-charge voltage is higher than the equalization voltage and lower than the first pre-charge voltage. The source voltage and the equalization voltage may be equal.

A selecting voltage may be applied to a selected one of the first word line and the second word line during the read and write operations. The selecting voltage may include the sum of the source voltage and a predetermined voltage between a first threshold voltage of the memory cell corresponding to data "1" being stored and a second threshold voltage of the memory cell corresponding to data "0" being stored. The selecting voltage may be the second pre-charge voltage.

The sense amplifier of the semiconductor memory device may include an equalization circuit for equalizing the sense bit line and the inverted sense bit line to be the equalization voltage in response to an equalization control signal during the equalization operation. The sense amplifier may further include a first pre-charge circuit for pre-charging the sense bit line to the first pre-charge voltage and the inverted sense bit line to the second pre-charge voltage in response to a first pre-charge control signal when the first block is selected during the pre-charge operation. The sense amplifier may likewise include a second pre-charge circuit for pre-charging the inverted sense bit line to the first pre-charge voltage and the sense bit line to the second pre-charge voltage in response to a second pre-charge control signal when the second block is selected during the pre-charge operation. The sense amplifier may further include a bit line sense amplifier for sensing and amplifying a voltage difference between the sense bit line and the inverted sense bit line in response to sense enable control signals during the write and read operations. The sense amplifier may also include a column selecting gate for selecting data between the sense bit line and a data line, and between the inverted sense bit line and an inverted data line during the write and read operations.

The bit line isolation portion of the semiconductor memory device may include a first bit line isolation gate for connecting the first bit line and the sense bit line in response to a first bit line isolation control signal during the equalization operation, the pre-charge operation and a first read operation of the read operation, and for isolating the first bit line and the sense bit line when the second block is selected during a second read operation of the read operation. It may also include a second bit line isolation gate for connecting the second bit line and the inverted sense bit line in response to a second bit line isolation control signal during the equalization operation, the pre-charge operation and the first read operation, and for isolating the second bit line and the inverted sense bit line when the first block is selected during the second read operation. Each of the first and second bit line isolation gates may be an NMOS transistor or a CMOS transmission gate.

The equalization circuit of the semiconductor memory device may include a first NMOS transistor connected to the sense bit line and transmitting the equalization voltage in response to the equalization control signal. It may also include a second NMOS transistor connected to the inverted sense bit line and transmitting the equalization voltage in response to the equalization control signal. The first pre-charge circuit may include a first PMOS transistor connected to the sense bit line and transmitting the first pre-charge voltage in response to the first pre-charge control signal, and a second PMOS transistor connected to the inverted sense bit line and transmitting the second pre-charge voltage in response to the first pre-charge control signal. Likewise, the second pre-charge circuit may include a third PMOS transistor connected to the sense bit line and transmitting the second pre-charge voltage in response to the second pre-charge control signal, and a fourth PMOS transistor connected to the inverted sense bit line and transmitting the first pre-charge voltage in response to the second pre-charge control signal.

The bit line sense amplifier of semiconductor memory device may include a PMOS sense amplifier connected between the sense bit line and the inverted sense bit line to amplify data of a low level of one of the sense bit line and the inverted sense bit line to a ground voltage level lower than the equalization voltage in response to one sense enable control signal. The bit line sense amplifier may also include an NMOS sense amplifier connected between the sense bit line and the inverted sense bit line to amplify data of a high level of the other of the sense bit line and the inverted sense bit line to a high voltage level higher than the first pre-charge voltage in response to the other sense enable control signal The semiconductor memory device may also include a controller for activating the first and second bit line isolation control signals and the equalization control signal during the equalization operation. The controller also deactivates the equalization control signal when the first block is selected during the pre-charge operation, activates the first pre-charge control signal, deactivates the equalization control signal when the second block is selected, activates the second pre-charge control signal, and activates the sense enable control signal and the inverted sense enable control signal during the write and read operations when a predetermined time lapses after a selecting voltage is applied to the first word line. The controller performs the equalization operation before the write operation and performs the equalization operation and the pre-charge operation before the read operation.

The first block of the semiconductor memory device may have a third memory cell having a floating body connected between a third bit line and the source line and having a third gate connected to the first word line. Likewise, the second block may include a fourth memory cell having a floating body connected between a fourth bit line and the source line and having a fourth gate connected to the second word line, the bit line isolation portion transmitting data between the third bit line and the inverted sense bit line and transmitting data between the fourth bit line and the sense bit line. The bit line gate portion may then include a third bit line isolation gate for connecting the third bit line and the inverted sense bit line in response to a third bit line isolation control signal during the equalization operation, the pre-charge operation and the first read operation, and for isolating the third bit line and the inverted sense bit line when the third memory cell is selected during the second read operation. The bit line gate portion may likewise include a fourth bit line isolation gate for connecting the fourth bit line and the sense bit line in response to a fourth bit line isolation control signal during the equalization operation, the pre-charge operation and the first read operation, and for isolating the fourth bit line and the sense bit line when the fourth memory cell is selected during the second read operation. Each of the third and fourth bit line isolation gates may include an NMOS transistor, or a CMOS transmission gate.

The controller may activate the third and fourth bit line isolation control signals and the equalization control signal during the equalization operation, deactivate the equalization control signal when the first block is selected during the pre-charge operation, activate the first pre-charge control signal, deactivate the equalization control signal when the second block is selected, activate the second pre-charge control signal, and activate the sense enable control signal and the inverted sense enable control signal during the write and read operations when a predetermined time lapses after a selecting voltage is applied to the first word line. The controller may also perform the equalization operation before the write operation and performs the equalization operation and the pre-charge operation before the read operation Another aspect of the present invention provides an operating method of a semiconductor memory device including a memory cell array having first and second blocks, where the first block includes a first memory cell, with a floating body, connected between a first bit line and a source line to which a source voltage is applied and a gate connected to a first word line. The second block includes a second memory cell, with a floating, body, connected between a second bit line and the source line and a gate connected to a second word line.

The method includes connecting the first bit line and a sense bit line, connecting the second bit line and an inverted sense bit line, and equalizing the first and second bit lines, the sense bit line and the inverted sense bit line comprising an equalization voltage level, during an equalization operation. The method also includes pre-charging the first bit line and the sense bit line to a first pre-charge voltage and pre-charging the inverted sense bit line to a second pre-charge voltage when the first block is selected during a pre-charge operation, the first pre-charge voltage being higher than the equalization voltage and the second pre-charge voltage being lower than the first pre-charge voltage and higher than the equalization voltage. Further, the method includes pre-charging the second bit line and the inverted sense bit line to the first pre-charge voltage and pre-charging the sense bit line to the second pre-charge voltage when the second block is selected during the pre-charge operation. A selecting voltage is applied to a selected one of the first word line and the second word line during a first read operation. The method also includes disconnecting the first bit line and the sense bit line and amplifying data of the first bit line and the inverted sense bit line when the first word line is selected, and disconnecting the second bit line and the inverted sense bit line and amplifying data of the second bit line and the sense bit line when the second word line is selected during a second read operation. The source voltage and the equalization voltage may be equal.

The selecting voltage may be a sum of the source voltage and a predetermined voltage between a first threshold voltage of the memory cell when data "1" is stored and a second threshold voltage of the memory cell when data "0" is stored. Also, the selecting voltage may be the second pre-charge voltage.

When applying the selecting voltage during the first read operation, a bit line connected to the first memory cell or the second memory cell which stores data "1" falls from the first pre-charge voltage to a voltage level lower than the equalization voltage, and a bit line connected to the first memory cell or the second memory cell which stores data "0" maintains the second pre-charge voltage.

The method may further include disconnecting the first bit line and the sense bit line, and amplifying data of the first bit line and the inverted sense bit line when the first word line is selected, during a write operation after the equalization operation. Likewise, the method may include disconnecting the second bit line and the inverted sense bit line, and amplifying data of the second bit line and the sense bit line when the second word line is selected, during the write operation after the equalization operation.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
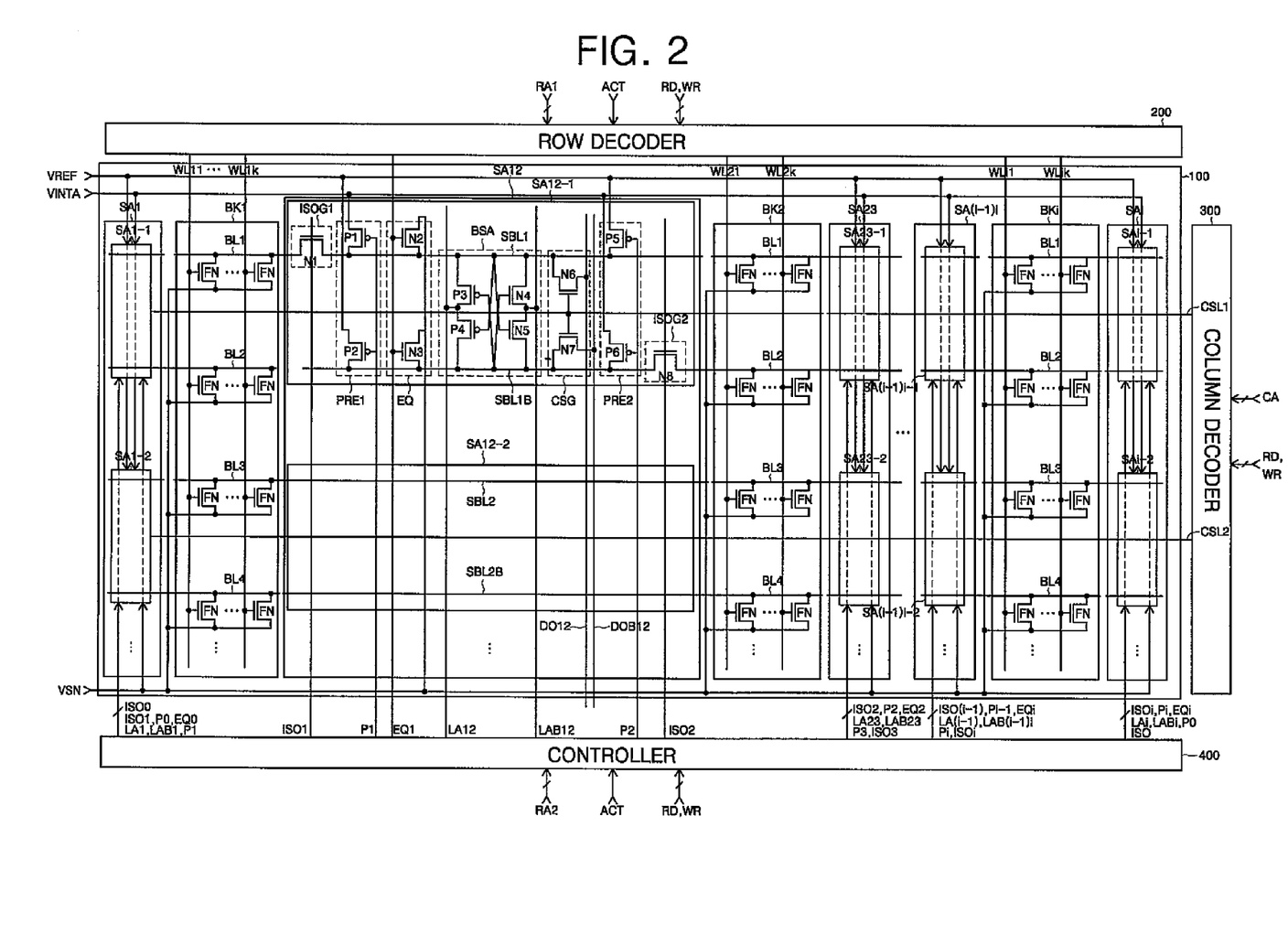
FIG. 2 is a circuit diagram illustrating a semiconductor memory device which includes a memory cell with a floating body, according to an exemplary embodiment of the present invention.

FIG. 2 is a circuit diagram illustrating an exemplary semiconductor memory device, which includes a memory cell with a floating body, according to an embodiment of the present invention. The semiconductor memory device of FIG. 2 includes a memory tell array 100, a row decoder 200, a column decoder 300, and a controller 400. The memory cell array block 100 includes i memory cell array blocks BK1 to BKi and i sensing blocks SA1 to SAi.

Each of the sensing blocks SA1 to SAi includes sense amplifiers (SA1-1, SA1-2, . . . ) to (SAi-1, SAi-2, . . . ), and each of the sense amplifiers includes bit line isolation gates ISOG1 and ISOG2, a bit line sense amplifier BSA, a column selecting gate CSG, pre-charge circuits PRE1 and PRE2, and an equalization circuit EQ. The bit line isolation gate ISOG1 includes an NMOS transistor N1, and the bit line isolation gate ISOG2 includes an NMOS transistor N8. The bit line sense amplifier BSA includes PMOS transistors P3 and P4 and NMOS transistors N4 and N5. The column selecting gate CSG includes NMOS transistors N6 and N7. The pre-charge circuit PRE1 includes PMOS transistors P1 and P2, and the pre-charge circuit PRE2 includes PMOS transistors P5 and P6. The equalization circuit EQ includes NMOS transistors N2 and N3.

Each of the i memory cell array blocks BK1 to BKi includes a plurality of memory cells FN with a floating body connected between word lines WL11 to WL1k, . . . , WLi1 to WLik and bit lines BL1, BL2, BL3, BL4 . . . . Each of the memory cells FN includes a first electrode (drain), commonly connected to a corresponding bit line among the bit lines BL1, BL2, BL3, BL4, . . . , a second electrode to which a source voltage VSN is commonly applied, and a gate connected to a corresponding one of the word lines WL11 to WL1k, . . . , WLi1 to WLik. In the semiconductor memory device of FIG. 2, the bit lines BL1, BL2, BL3, BL4 . . . are arranged to have an open bit line structure.

Functions of the components of FIG. 2 are described below. The memory cell array 100 may write/read data to/from two memory cells connected between a selected word line and two bit lines selected by a column selecting signal. The memory cell array block BK1 writes data transmitted from two data I/O line pairs DOI, DOB1 (not shown) and DO12, DOB12, and reads stored data through the two data I/O line pairs DO1, DOB1 (not shown) and DO12, DOB12. Each of the memory cell array blocks BK2 to BKi similarly inputs/outputs data through two data I/O line pairs arranged on both sides.

The row decoder 200 decodes a first row address RA1 to activate one of the word lines WL11 to WL1k, . . . , WLi1 to WLik when an active command ACT is applied. The row decoder 200 may be configured to fix an activation time period of the word line selecting signal, regardless of a read command RD and a write command WR, or to vary the activation time period of the word line selecting signal, depending on the read command RD and the write command WR. The column decoder 300 decodes a column address CA to generate the column selecting signal for selecting column selecting signals CSL1, CSL2, . . . , when the read command RD or the write command WR is applied.

The controller 400 decodes a second row address RA2 for designating the memory cell array blocks BK1 to BKi to generate bit line isolation control signals ISO1 to ISO1, sense enable control signal pairs LA1,LAB1 to Lai,LABi, equalization control signals EQ0 to EQi, and pre-charge control signals P0 to Pi when the active command ACT is applied. The controller 400 activates the bit line isolation control signal ISO1 when the second row address RA2 is art address for designating the memory cell array block BK1, and generates the sense enable control signal pairs LA1,LAB1, and LA12,LAB12 when the read command RD or the write command WR is applied.

The controller 400 can adjust the activation time period of the bit line isolation control signal ISO and the activation time period of the sense enable control signal pairs LA1,LAB1, and LA12,LAB12 according to the read command RD and the write command WR. That is, the controller 400 activates the bit line isolation control signal of both sides of the memory cell array block designated by the second row address RA2 and applies a sensing voltage through the sense enable control signal. The bit line isolation gates ISOG1 to ISOGi are turned ON to connect the bit lines and sense bit line pairs in response to the bit line isolation control signals ISO1 to ISOi, respectively.

The bit line isolation control signals ISO1 to ISOi are activated when the corresponding memory cell array blocks BK1 to BKi are designated. For example, when the memory cell array block BK1 is designated, the bit line isolation control signal IOS1 is activated to turn ON the NMOS transistor N1 of the bit line isolation gate ISOG1.

The bit line sense amplifiers BSA detect and amplify voltage differences of the sense bit line pairs SBL1,SBL1B, SBL2,SBL2B, . . . in response to the corresponding sense enable control signal pairs LA1,LAB1 to LAi,LABi, respectively. For example, when the memory cell array block BK1 is designated, the sense enable control pairs LA1,LAB1 and LA12,LAB12 are generated. The equalization circuit EQ operates such that the NMOS transistors N2 and N3 are turned ON to apply an equalization voltage VSN to the corresponding sense bit line pairs SBL1,SBL1B, SBL2, SBL2B, . . . in response to equalization control signals EQ1 to EQi. In the exemplary embodiment, the equalization voltage VSN and the source voltage are configured to have the same level, although they may be configured to have different levels.

The pre-charge circuits PRE1 and PRE2 operate such that the PMOS transistors P1, P2, P5 and P6 are turned ON to apply an internal voltage VINTA to one line of the corresponding sense bit line pairs SBL1,SBL1B, SBL2, SBL2B, . . . and to apply a reference voltage VREF to the other line, in response to the corresponding pre-charge control signals P0 to Pi, respectively. That is, the internal voltage VINTA is applied to a line among the sense bit line pairs to which data of the memory cell are transmitted.

The semiconductor memory device of FIG. 2 does not have a reference memory cell and is simple in configuration of the sensing block for a data read operation, as compared to the conventional semiconductor memory device of FIG. 1.

Figure 3A:
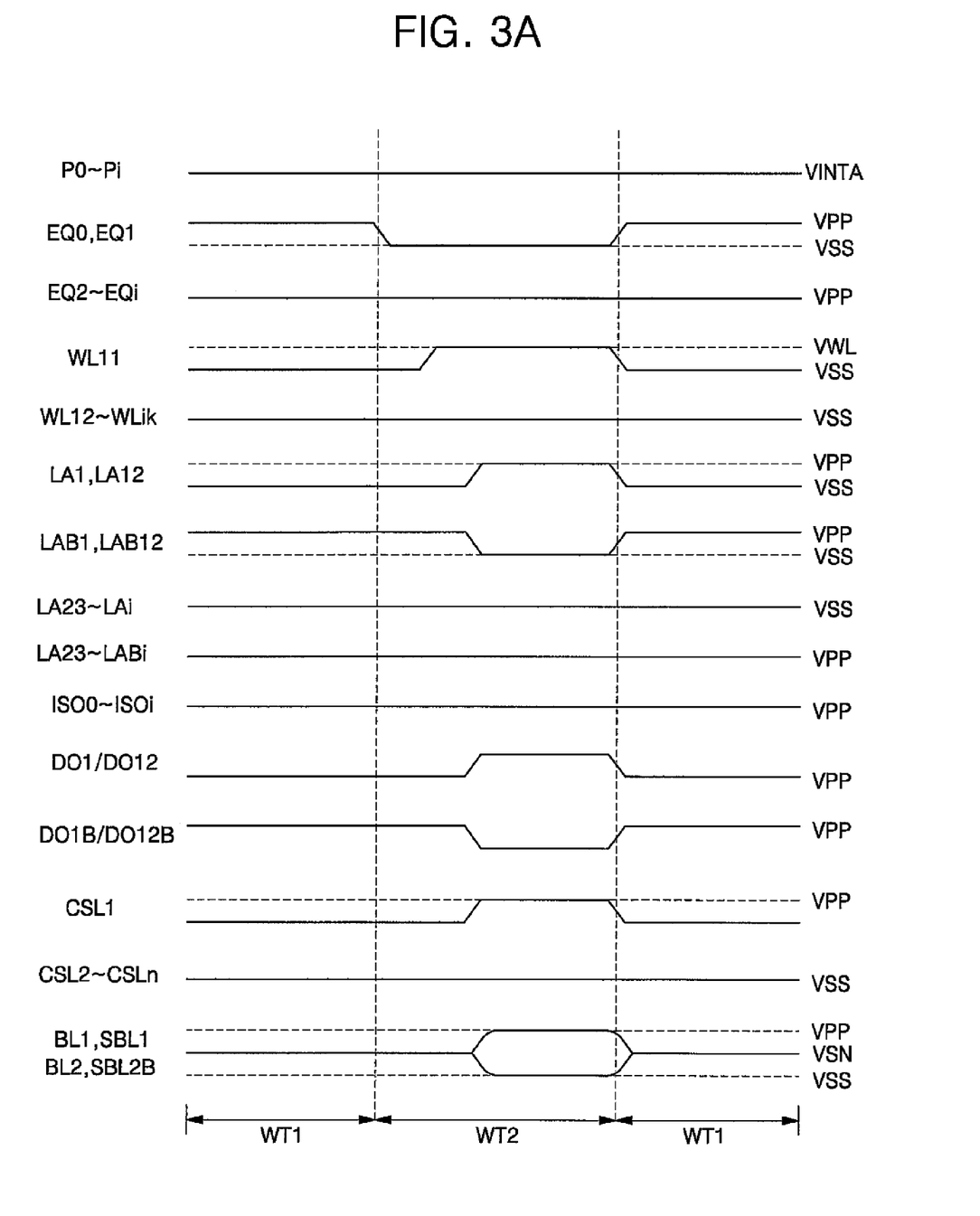
FIG. 3a is an operation timing diagram illustrating a data write operation of the semiconductor memory device of FIG. 2.

FIG. 3a is an operation timing diagram illustrating a data write operation of the semiconductor memory device of FIG. 2. In FIG. 3a, the first row address RA1 for selecting the word line WL11 and the second row address RA2 for designating the memory cell array block BK1 are applied together with the active command ACT. The column address CA for selecting the column selecting signal line CSL1 is applied together with the write command.

During an equalization time period WT1, the controller 400 generates the pre-charge control signals P0 to Pi having the internal voltage VINTA, the equalization control signals EQ0 to EQi having a high voltage VPP, and the bit line isolation control signals ISO0 to ISOi having a high voltage VPP. The PMOS transistors P1, P2, P5, and P6 of the pre-charge circuits PRE1 and PRE2 are turned OFF, the NMOS transistors N2 and N3 of the equalization circuits EQ are turned ON, and the NMOS transistors N1 and N8 of the bit line 20 isolation gates ISOG1 and ISOG2 are turned ON, so that the bit lines BL1, BL2, . . . and the sense bit line pairs SBL1,SBL1B, SBL2,SBL2B, . . . are equalized to be the equalization voltage VSN.

During a write time period WT2, the controller 400 generates the equalization control signals EQ0 and EQ1 at a ground voltage VSS level and the equalization control signals EQ2 to EQi at a high voltage VPP level in response to the second row address RA2 for designating the memory cell array block BK1. The bit line isolation control signals ISO0 to ISOi maintain the high voltage VPP level. As a result, the equalization circuits EQ of both sides of the memory cell array block BK1 are turned OFF. Then, the row decoder 200 decodes the first row address RA1 to generate a word line selecting signal having a selecting voltage (VWL=VSN+(Vth0+Vth1)/2, or reference voltage VREF, VSN (<VPP, <VREF, >VSS)) level for selecting the word line WL11. Here, Vth0 denotes a threshold voltage of a memory cell FN in which data "0" is stored, and Vth1 denotes a threshold voltage of a memory cell FN in which data "1" is stored. The threshold voltage Vth0 is higher than the threshold voltage Vth1.

The controller 400 generates the sense enable control signals LA1 and LA12 at the high voltage VPP and the sense enable control signals LAB1 and LAB12 of the ground voltage VSS in response to the write command WR and the second row address RA2. The column decoder 300 generates the column selecting signal CSL1 having the high voltage VPP level in response to the write command WR and the column address CA. As a result, the column selecting gates CSG of both sides of the memory cell array block BK1 are turned ON to transmit a data pair having a high level and a low level of each of the data line pairs DO1,DO1B (not shown) and DO12,DO12B, . . . . Also, the bit line sense amplifiers BSA of both sides are turned ON to amplify a data pair transmitted to each of the sense bit line pairs SBL1 ,SBL1B, making the sense bit line pairs SBL1,SBL1B become the high voltage VPP level and the ground voltage VSS level, respectively. Also, since the bit line isolation gates ISOG1 and ISOG2 are turned ON, amplified data of each of the sense bit lines SBL1B and SBL1 of both sides are transmitted to the bit lines BL2 and BL1, respectively.

At this time, since the selecting voltage VWL is being applied to the gates of the two memory cells FN of the memory cell array block BK1, impact ionization occurs in the memory cell FN connected to the bit line BL1 between the two memory cells FN, so that holes are accumulated in the floating body of the memory cells FN to write data "1", and the memory cell FN connected to the bit line BL2 is forward-biased to write data "0". As a result, the threshold voltage of the memory cell FN which stores data "1" becomes Vth1 and the threshold voltage of the memory cell FN which stores data "0" becomes Vth0.

Thereafter, the controller 400 performs the same operation as in the equalization time period WT1 to equalize the bit lines BL1, BL2, . . . and the sense bit line pairs SBL1,SBL1B, SBL2,SBL2B, . . . to be the equalization voltage VSN level.

As described above, data "1" is written to the memory cell FN between the word line WL11 and the bit line BL1 of the memory cell array block BK1, and data "0" is written to the memory cell FN between the word line WL11 and the bit line BL2 of the memory cell array block BK1.

Figure 3B:
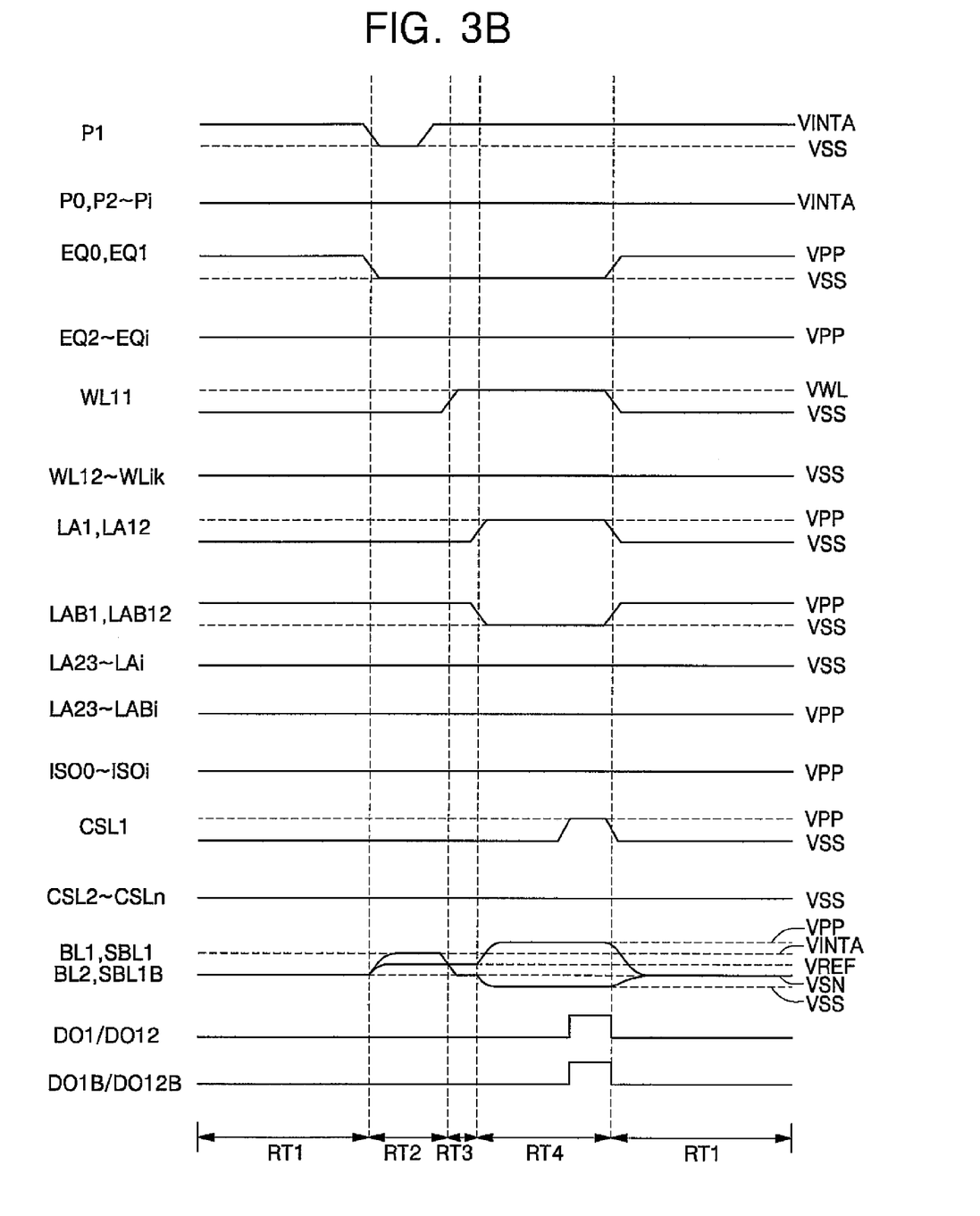
FIG. 3b is an operation timing diagram illustrating a data read operation of the semiconductor memory device of FIG. 2.

FIG. 3b is an operation timing diagram illustrating a data read operation of the semiconductor memory device of FIG. 2. FIG. 3b shows an operation for reading data "1" and data "0" stored, for example, in the two memory cells FN of the memory cell array block BK1 by the operation of FIG. 3a.

During an equalization time period RT1 the controller 400 performs the same operation as in the equalization time period WT1 of FIG. 3a to equalize the bit lines BL1, BL2, . . . , and the sense bit line pairs SBL1,SBL1B, SBL2,SBL2B, . . . to be the equalization voltage VSN level.

During a pre-charge time period RT2, the controller 400 generates the pre-charge control signal P1 having the ground voltage level VSS level and the equalization control signals EQ0 and EQ1 having the ground voltage VSS level. The controller 400 maintains the bit line isolation control signals ISO0 to ISOi at the high voltage VPP level, in response to the second row address RA2 for designating the memory cell array block BK1. As a result, the pre-charge circuits PRE2 on the left side of the memory cell array block BK1 are turned ON to make the inverted sense bit line SBL1B and the bit line BL2 on the left side and the sense bit line SBL1 and the bit line BL1 on the right side become the internal voltage VINTA (<VPP, >VSN) level, and to make the sense bit line SBL1 on the left side and the inverted sense bit line SBL1B on the right side become the reference voltage VREF (<VINTA, >VSN) level. That is, during a pre-charge operation, the pre-charge circuits PRE1 and PRE2 operate to make a line from which data are read become the internal voltage VINTA level, and to make the other line become the reference voltage VREF level.

During a first read time period RT3, the controller 400 generates the pre-charge control signal P1 at the internal voltage VINTA level and maintains the equalization control signals EQ0 and EQ1 at the ground voltage VSS level. The row decoder 200 decodes the first row address RA1 to generate the word line selecting signal having a selecting voltage (VWL=VSN+(Vth0+Vth1)/2 or VREF) level for selecting the word line WL11. As a result, because data "1" is stored in the memory cell FN connected between the word line WL11 and the bit line BL1 and a level of the selecting voltage is higher than the threshold voltage Vth1, an electric current flows, whereas because data "0" is stored in the memory cell FN connected between the word line WL11 and the bit line BL2 and a level of the selecting voltage is lower than the threshold voltage Vth0, an electric current does not flow. The bit line BL1 and the sense bit line SBL1 of the memory cell array block BK1 falls to from the internal voltage VINTA level to a level lower than the reference voltage VREF level, and the bit line BL2 and the inverted sense bit line SBL1B of the memory cell array block BK1 maintain the reference voltage VREF level. Thus, a voltage difference ΔV between the sense bit line pairs SBL1,SBL1B, SBL2,SBL2B, . . . becomes a level which can be detected by the bit line sense amplifiers SA12 and SA1.

During a second read time period RT4, the controller 400 generates the sense enable control signals LA1 and LA12 at the high voltage VPP level and the sense enable control signals LAB1 and LAB12 at the ground voltage VSS level, and maintains the bit line isolation control signal ISO1 at the high voltage VPP level. The NMOS transistors N1 and N8 of the bit line isolation gate ISOG1 on a left side and the bit line isolation gate ISOG2 on a right side of the memory cell array block BK1, respectively, are turned OFF. Therefore, the bit line BL1 and the sense bit line SBL1 are isolated and the bit line BL2 and the inverted sense bit line SBL1B are isolated. The bit line sense amplifiers of both sides of the memory cell array block BK1 are turned ON to amplify a voltage difference of the sense bit line pairs SBL1 ,SBL1B, SBL2, SBL2B, . . . , thereby amplifying them to the ground voltage VSS level and the high voltage VPP level.

Thereafter, the column decoder 300 decodes the column address CA to generate the column selecting signal CSL1 at the high voltage VPP level, and so the NMOS transistors N6 and N7 of the column selecting gates CSG of both sides are turned ON to transmit data pairs of a low level and a high level of the sense bit line pair SBL1,SBL1B of both sides to the data line pairs DO1,DO1B (not shown) and DO12,DO12B, respectively. At this time, the data pairs transmitted to the data line pairs DO1,DO1B (not shown) and DO12,DO12B have an opposite phase to the data pairs stored in the memory cells FN. Though not shown in the semiconductor memory device of FIG. 2, this can be realized by adding a configuration which inverts and outputs a phase of data transmitted to the data line pairs during the read operation to convert them into data pairs having the same phase as a phase of data pairs stored in the memory cells FN Thereafter, the controller 400 performs the same operation as in the equalization time period RT1 to equalize the bit lines BL1, BL2, . . . , and the sense bit line pairs SBL1,SBL1B, SBL2,SBL2B, . . . to the equalization voltage VSN level.

As described above, data "1" is read from the memory cell FN between the word line WL11 and the bit line BL1 of the memory cell array block BK1, and data "0" is read from the memory cell FN between the word line WL11 and the inverted bit line BL1B.

The semiconductor memory device according to an embodiment of the present invention performs the pre-charge operation before the read operation to make the bit line and the sense bit line become the internal voltage VINTA level higher than the equalization voltage VSN level, and to make the inverted sense bit line become the reference voltage VREF level between the equalization voltage VSN and the internal voltage VINTA. Also, the semiconductor memory device of the present invention applies the selecting voltage VWL to the memory cell to turn OFF the memory cell FN storing data "0" to maintain the reference voltage VREF level "as is" and to turn ON the memory cell FN storing data "1" to allow a small amount of electric current to flow, thereby transitioning a voltage of the bit line from the internal voltage VINTA level to a level lower than the reference voltage VREF level. The semiconductor memory device then turns OFF the bit line isolation gate and performs the sensing operation for the sense bit line pair, whereby data stored in the memory cell are not altered but maintained "as is," so that the refresh (re-storing) operation is not needed.

Figure 4:
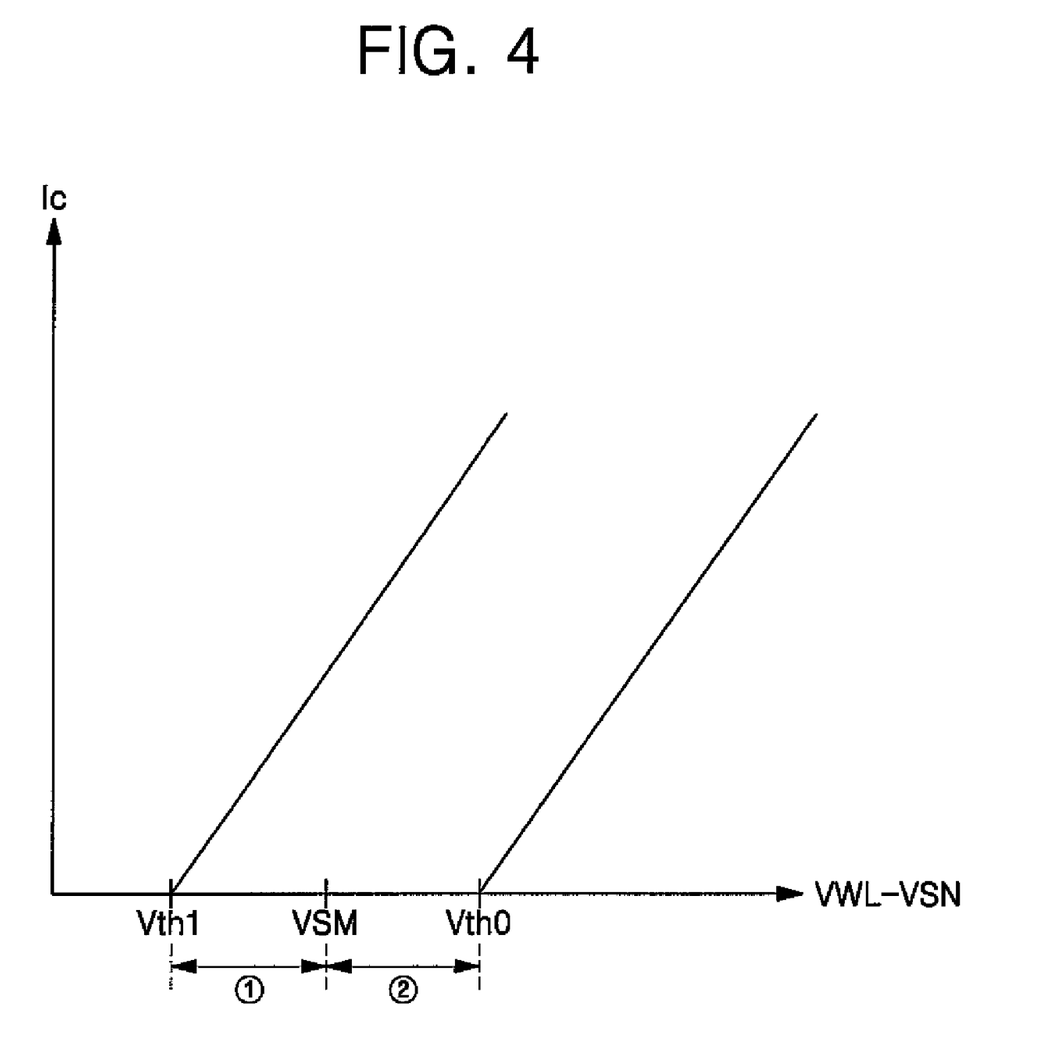
FIG. 4 is a graph illustrating setting a voltage level of a selecting signal for selecting a word line in the semiconductor memory device.

FIG. 4 is a graph illustrating setting a voltage level of the selecting signal for selecting the word line in the semiconductor memory device, according to an embodiment of the present invention. In the graph of FIG. 4, the horizontal axis denotes a voltage (VWL−VSN) obtained by subtracting the equalization voltage VSN from the selecting voltage VWL. The vertical axis denotes an electric current Ic which flows through the memory cell. As indicated by FIG. 4, in the memory cell FN with the floating body, the threshold voltage Vth1 (when data "1" is stored) is lower than the threshold voltage Vth0 (when data "0" is stored).

In the embodiment of the present invention described above, the selecting voltage VWL is set to a value obtained by adding a medium value (VSN=(Vth1+Vth0)/2), i.e., a value between the threshold voltage Vth1 and the threshold voltage Vth0, to the equalization voltage VSN. However, the selecting voltage VWL may be set to an alternative value obtained by adding another voltage between the threshold voltage Vth1 and the threshold voltage Vth0 to the equalization voltage VSN. For example, the selecting voltage VWL may be set to a value obtained by adding a voltage that is greater than the threshold voltage Vth1 and smaller than the medium value VSM (e.g. a voltage from section (1)) to the equalization voltage VSN, or the selecting voltage VWL may be set to a value obtained by adding a voltage that is greater than the medium value VSM and lower than the threshold voltage Vth0 (e.g. a voltage from section (2)) to the equalization voltage VSN.

By applying the selecting voltage VWL, as described above, to the memory cell FN, the memory cell FN storing data "1" is turned ON to allow the memory cell current Ic to flow from the bit line to the source line, and the memory cell FN storing data "0" is turned OFF to prevent the flow of the current Ic from the bit line to the source line. Thus, it is possible to distinguishably read the memory cell storing data "1" and the memory cell storing data "0".

Figure 5:
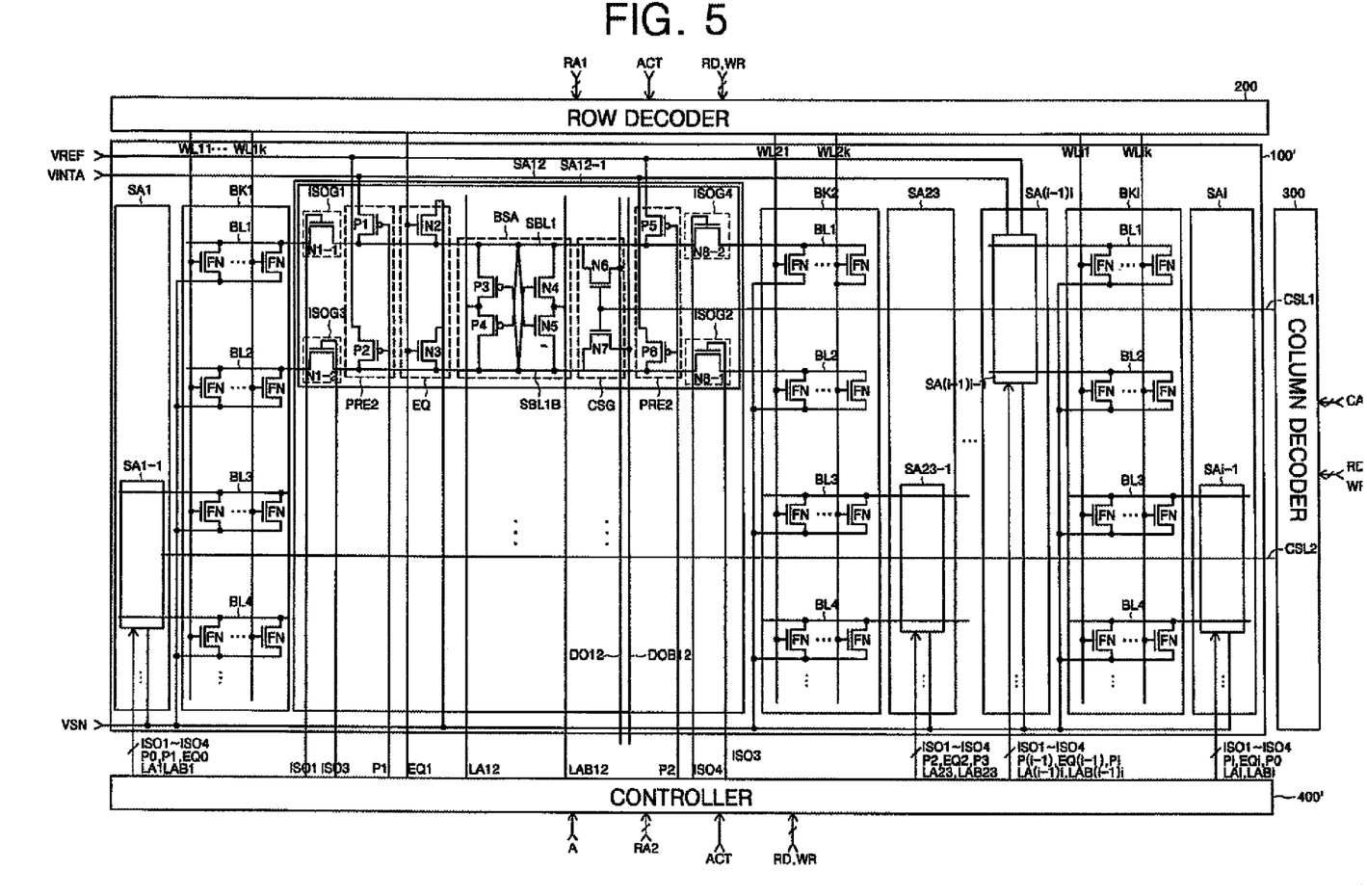
FIG. 5 is a circuit diagram illustrating a semiconductor memory device which includes a memory cell with a floating body, according to another exemplary embodiment of the present invention.

FIG. 5 is a circuit diagram illustrating an exemplary semiconductor memory device, which includes a memory cell with a floating body, according to another embodiment of the present invention. The semiconductor memory device of FIG. 5 includes a memory cell array 100', a row decoder 200, a column decoder 300 and a controller 400'. The memory cell array block 100' includes i memory cell array blocks BK1 to BKi and i sensing blocks SA1 to SAi.

Each of the sensing blocks SA1 to SAi includes sense amplifiers (SA1-1, SA1-2, . . . . ) to (SAi-1, SAi-2, . . . ), and each of the sense amplifiers includes bit line isolation gates ISOG1 to ISOG4, a bit line sense amplifier BSA, a column selecting gate CSG, pre-charge circuits PRE1 and PRE2, and an equalization circuit EQ. The bit line isolation gates ISOG1 to ISOG4 comprise NMOS transistors N1-1, N8-1, N1-2, and N8-2, respectively. The bit line sense amplifier BSA, the pre-charge circuits PRE1 and PRE2, the column selecting gate CSG, and the equalization circuit EQ have the same configuration as those described above with respect to FIG. 2. Likewise, the memory cells FN of each of the i memory cell array blocks BK1 to BKI have the same configuration as those described above with respect to FIG. 2. In the semiconductor memory device of FIG. 5, the bit lines BL1, BL2, . . . are arranged to have a folded bit line structure.

Functions of the components of FIG. 5 are described below. The memory cell array 100' has a different configuration from the memory cell array 100 of FIG. 2, although the memory cell array 100' can similarly write/read data to/from two memory cells connected between a selected word line and two bit lines selected by a column selecting signal. Functions of the memory cell array blocks BK1 to BKi are identical to those of FIG. 2. The row decoder 200 and the column decoder 300 also perform the same functions as those described with respect to FIG. 2.

The controller 400' generates the bit line isolation control signals ISO0 to ISOi, the sense enable control signal pairs LA1,LAB1, LA12,LAB12, LA23,LAB23, . . . , LAi,LABi, the equalization control signals EQ0 to EQi, and the pre-charge control signals P0 to Pi, in response to the second row address RA2 for designating the memory cell array blocks BK1 to BKi and an address A for distinguishing the odd-numbered bit lines and the even-numbered bit lines, when the active command ACT is applied. The controller 400' activates the bit line isolation control signal ISO2 of the left side of the memory cell array block BK1 and the bit line isolation control signal ISO1 of the right side when the second row address RA2 designates the memory cell array block BK1 and the address A is an address for designating the odd-numbered bit lines. The controller 400' activates the bit line isolation control signal ISO4 of the left side of the memory cell array block BK1 and the bit line isolation control signal ISO3 of the right side when the address A is an address for designating the even-number bit lines. The controller 400' activates sense enable control signal pairs LA1,LAB1 and LA12,LAB12 when the read command RD or the write WR is applied. The controller 400' activates one of the four bit line isolation control signals of both sides of the memory cell array block designated by the second row address RA2 and activates the sense enable control signal pairs.

The bit line isolation gates ISO1 to ISO4 are turned ON to connect one line of the bit lines and the sense bit line pair in response to the bit line isolation control signals ISO1 to ISO4, respectively. The bit line isolation control signals ISO1 to ISO4 are activated when the corresponding memory cell array blocks BK1 to BKi are designated and the corresponding bit line is selected. The functionalities of the bit line sense amplifiers BSA, the equalization circuits EQ and the pre-charge circuits PRE1 and PRE2 are the same as those of FIG. 2. Also, similar to the semiconductor memory device of of FIG. 2, the semiconductor memory device of FIG. 5 does not have a reference memory cell and has a relatively simple configuration of the sensing block for a data read operation.

An operation of the semiconductor memory device of FIG. 5 may be understood with reference to the operation timing diagrams of FIGS. 3a and 3b.

In particular, the semiconductor memory device of FIG. 5 performs write and read operations such that the bit line isolation gate ISOG2 on the left side of the memory cell array block BK1 and the bit line isolation gate ISOG1 on the right side are turned ON when the memory cell array block BK1 and the odd-numbered bit lines are selected, and the bit line isolation gate ISOG4 on the left side of the memory cell array block BK1 and the bit line isolation gate ISOG3 on the right side are selected when the memory cell array block BK1 and the even-number bit lines are selected.

In the above-described embodiments, each of the bit line isolation gates include an NMOS transistor, but they may also include a CMOS transmission gate. That is, the bit line isolation gates may be configured such that a PMOS transistor is added between the bit line and the sense bit line, and an inverted signal of the bit line isolation control signal is applied to the gate of the PMOS transistor.

In addition, an NMOS transistor may be added to the equalization circuit of the semiconductor memory device of the present invention so that the NMOS transistor can connect the sense bit line and the inverted sense bit line in response to the equalization control signal.

As described above, the semiconductor memory device according s to the various embodiments of the present invention has a relatively simple sensing block configuration, is easy to control and can read data without a reference memory cell. Further, the semiconductor memory device and its operating method according to the various embodiments of the present invention do not need to perform the refresh (re-storing) operation after the data read operation.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device, comprising:
    a memory cell array comprising a first block and a second block, the first block comprising a first memory cell having a first floating body and the second block comprising a second memory cell having a second floating body, the first memory cell being connected between a first bit line and a source line to which a source voltage is applied and having a first gate connected to a first word line, the second memory cell being connected between a second bit line and the source line and having a second gate connected to a second word line;
    a bit line isolation portion for transmitting data between the first bit line and a sense bit line, and for transmitting data between the second bit line and an inverted sense bit line; and
    a sense amplifier for equalizing the sense bit line and the inverted sense bit line to be an equalization voltage during an equalization operation, for pre-charging one of the sense bit line or the inverted sense bit line to a first pre-charge voltage higher than the equalization voltage and the other of the sense bit line or the inverted sense bit line to a second pre-charge voltage higher than the equalization voltage and lower than the first pre-charge voltage during a pre-charge operation, and for sensing and amplifying a voltage difference between the sense bit line and the inverted sense bit line during read and write operations.

2. The semiconductor memory device of claim 1, wherein the source voltage and the equalization voltage are equal.

3. The semiconductor memory device of claim 1, wherein a selecting voltage is applied to a selected one of the first word line and the second word line during the read and write operations.

4. The semiconductor memory device of claim 3, wherein the selecting voltage comprises the sum of the source voltage and a predetermined voltage between a first threshold voltage of the memory cell corresponding to data "1" being stored and a second threshold voltage of the memory cell corresponding to data "0" being stored.

5. The semiconductor memory device of claim 3, wherein the selecting voltage comprises the second pre-charge voltage.

6. The semiconductor memory device of claim 1, wherein the sense amplifier comprises:
    an equalization circuit for equalizing the sense bit line and the inverted sense bit line to be the equalization voltage in response to an equalization control signal during the equalization operation;
    a first pre-charge circuit for pre-charging the sense bit line to the first pre-charge voltage and the inverted sense bit line to the second pre-charge voltage in response to a first pre-charge control signal when the first block is selected during the pre-charge operation;
    a second pre-charge circuit for pre-charging the inverted sense bit line to the first pre-charge voltage and the sense bit line to the second pre-charge voltage in response to a second pre-charge control signal when the second block is selected during the pre-charge operation; and
    a bit line sense amplifier for sensing and amplifying a voltage difference between the sense bit line and the inverted sense bit line in response to sense enable control signals during the write and read operations.

7. The semiconductor memory device of claim 6, wherein the sense amplifier further comprises a column selecting gate for selecting data between the sense bit line and a data line and between the inverted sense bit line and an inverted data line during the write and read operations.

8. The semiconductor memory device of claim 1, wherein the bit line isolation portion comprises:
    a first bit line isolation gate for connecting the first bit line and the sense bit line in response to a first bit line isolation control signal during the equalization operation, the pre-charge operation and a first read operation of the read operation, and for isolating the first bit line and the sense bit line when the second block is selected during a second read operation of the read operation; and a second bit line isolation gate for connecting the second bit line and the inverted sense bit line in response to a second bit line isolation control signal during the equalization operation, the pre-charge operation and the first read operation, and for isolating the second bit line and the inverted sense bit line when the first block is selected during the second read operation.

9. The semiconductor memory device of claim 8, wherein each of the first and second bit line isolation gates comprises an NMOS transistor.

10. The semiconductor memory device of claim 8, wherein each of the first and second bit line isolation gates comprises a CMOS transmission gate.

11. The semiconductor memory device of claim 6, wherein the equalization circuit comprises:
    a first NMOS transistor connected to the sense bit line and transmitting the equalization voltage in response to the equalization control signal; and
    a second NMOS transistor connected to the inverted sense bit line and transmitting the equalization voltage in response to the equalization control signal.

12. The semiconductor memory device of claim 6, wherein the first pre-charge circuit comprises:
    a first PMOS transistor connected to the sense bit line and transmitting the first pre-charge voltage in response to the first pre-charge control signal; and
    a second PMOS transistor connected to the inverted sense bit line and transmitting the second pre-charge voltage in response to the first pre-charge control signal.

13. The semiconductor memory device of claim 6, wherein the second pre-charge circuit comprises:
    a third PMOS transistor connected to the sense bit line and transmitting the second pre-charge voltage in response to the second pre-charge control signal; and
    a fourth PMOS transistor connected to the inverted sense bit line and transmitting the first pre-charge voltage in response to the second pre-charge control signal.

14. The semiconductor memory device of claim 6, wherein the bit line sense amplifier comprises:
    a PMOS sense amplifier connected between the sense bit line and the inverted sense bit line to amplify data of a low level of one of the sense bit line and the inverted sense bit line to a ground voltage level lower than the equalization voltage in response to one sense enable control signal; and
    an NMOS sense amplifier connected between the sense bit line and the inverted sense bit line to amplify data of a high level of the other of the sense bit line and the inverted sense bit line to a high voltage level higher than the first pre-charge voltage in response to the other sense enable control signal.

15. The semiconductor memory device of claim 1 further comprising:
    a controller for activating the first and second bit line isolation control signals and the equalization control signal during the equalization operation, deactivating the equalization control signal when the first block is selected during the pre-charge operation, activating the first pre-charge control signal, deactivating the equalization control signal when the second block is selected, activating the second pre-charge control signal, and activating the sense enable control signal and the inverted sense enable control signal during the write and read operations when a predetermined time lapses after a selecting voltage is applied to the first word line.

16. The semiconductor memory device of claim 15, wherein the controller performs the equalization operation before the write operation and performs the equalization operation and the pre-charge operation before the read operation.

17. The semiconductor memory device of claim 1, wherein the first block further comprises a third memory cell having a floating body connected between a third bit line and the source line and having a third gate connected to the first word line, and wherein the second block further comprises a fourth memory cell having a floating body connected between a fourth bit line and the source line and having a fourth gate connected to the second word line, the bit line isolation portion transmitting data between the third bit line and the inverted sense bit line and transmitting data between the fourth bit line and the sense bit line.

18. The semiconductor memory device of claim 17, wherein the bit line gate portion comprises:
    a third bit line isolation gate for connecting the third bit line and the inverted sense bit line in response to a third bit line isolation control signal during the equalization operation, the pre-charge operation and a first read operation of the read operation, and for isolating the third bit line and the inverted sense bit line when the third memory cell is selected during a second read operation of the read operation; and
    a fourth bit line isolation gate for connecting the fourth bit line and the sense bit line in response to a fourth bit line isolation control signal during the equalization operation, the pre-charge operation and the first read operation, and for isolating the fourth bit line and the sense bit line when the fourth block block is selected during the second read operation.

19. The semiconductor memory device of claim 18, wherein each of the third and fourth bit line isolation gates comprises an NMOS transistor.

20. The semiconductor memory device of claim 18, wherein each of the third and fourth bit line isolation gates comprises a CMOS transmission gate.

21. The semiconductor memory device of claim 18, further comprising:
    a controller for activating the third and fourth bit line isolation control signals and the equalization control signal during the equalization operation, deactivating the equalization control signal when the first block is selected during the pre-charge operation, activating the first pre-charge control signal, deactivating the equalization control signal when the second block is selected, activating the second pre-charge control signal, and activating the sense enable control signal and the inverted sense enable control signal during the write and read operations when a predetermined time lapses after a selecting voltage is applied to the first word line.

22. The semiconductor memory device of claim 21, wherein the controller performs the equalization operation before the write operation and performs the equalization operation and the pre-charge operation before the read operation.

23. An operating method of a semiconductor memory device including a memory cell array having first and second blocks, the first block comprising a first memory cell, having a floating body, connected between a first bit line and a source line to which a source voltage is applied and a gate connected to a first word line, the second block comprising a second memory cell, having a floating body, connected between a second bit line and the source line and a gate connected to a second word line, the method comprising:

connecting the first bit line and a sense bit line, connecting the second bit line and an inverted sense bit line, and equalizing the first and second bit lines, the sense bit line and the inverted sense bit line comprising an equalization voltage level, during an equalization operation;

pre-charging the first bit line and the sense bit line to a first pre-charge voltage and pre-charging the inverted sense bit line to a second pre-charge voltage when the first block is selected during a pre-charge operation, the first pre-charge voltage being higher than the equalization voltage and the second pre-charge voltage being lower than the first pre-charge voltage and higher than the equalization voltage;

pre-charging the second bit line and the inverted sense bit line to the first pre-charge voltage and pre-charging the sense bit line to the second pre-charge voltage when the second block is selected during the pre-charge operation;

applying a selecting voltage to a selected one of the first word line and the second word line during a first read operation; and disconnecting the first bit line and the sense bit line and amplifying data of the first bit line and the inverted sense bit line when the first word line is selected, and disconnecting the second bit line and the inverted sense bit line and amplifying data of the second bit line and the sense bit line when the second word line is selected during a second read operation.

24. The operating method of claim 23, wherein the source voltage and the equalization voltage are equal.

25. The operating method of claim 23, wherein the selecting voltage comprises a sum of the source voltage and a predetermined voltage between a first threshold voltage of the memory cell when data "1" is stored and a second threshold voltage of the memory cell when data "0" is stored.

26. The operating method of claim 23, wherein the selecting voltage comprises the second pre-charge voltage.

27. The operating method of claim 23, wherein, when applying the selecting voltage during the first read operation, a bit line connected to the first memory cell or the second memory cell which stores data "1" falls from the first pre-charge voltage to a voltage level lower than the equalization voltage, and a bit line connected to the first memory cell or the second memory cell which stores data "0" maintains the second pre-charge voltage.

28. The operating method of claim 23, further comprising:
disconnecting the first bit line and the sense bit liner and amplifying data of the first bit line and the inverted sense bit line when the first word line is selected, during a write operation after the equalization operation; and
disconnecting the second bit line and the inverted sense bit line, and amplifying data of the second bit line and the sense bit line when the second word line is selected, during the write operation after the equalization operation.

* * * * *